(12) United States Patent
Oshima

(10) Patent No.: US 11,488,972 B2
(45) Date of Patent: Nov. 1, 2022

(54) SEMICONDUCTOR STORAGE DEVICE AND METHOD OF MANUFACTURING THE SAME

(71) Applicant: Kioxia Corporation, Minato-ku (JP)

(72) Inventor: Yasunori Oshima, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 289 days.

(21) Appl. No.: 16/809,753

(22) Filed: Mar. 5, 2020

(65) Prior Publication Data

US 2021/0082935 A1 Mar. 18, 2021

(30) Foreign Application Priority Data

Sep. 13, 2019 (JP) .............................. JP2019-167179

(51) Int. Cl.
| | |
|---|---|
| *H01L 27/11556* | (2017.01) |
| *H01L 27/11582* | (2017.01) |
| *H01L 21/8234* | (2006.01) |
| *G11C 5/06* | (2006.01) |
| *G11C 5/02* | (2006.01) |

(52) U.S. Cl.
CPC ........ *H01L 27/11556* (2013.01); *G11C 5/025* (2013.01); *G11C 5/06* (2013.01); *H01L 21/823412* (2013.01); *H01L 27/11582* (2013.01)

(58) Field of Classification Search
CPC ......... H01L 27/11556; H01L 27/11582; H01L 21/823412; G11C 5/025; G11C 5/06
USPC ....................................................... 257/314
See application file for complete search history.

(56) References Cited

U.S. PATENT DOCUMENTS

| | | | |
|---|---|---|---|
| 9,111,964 B2 | 8/2015 | Sato et al. | |
| 9,520,407 B2 | 12/2016 | Fukuzumi et al. | |
| 10,347,654 B1 | 7/2019 | Iwai et al. | |
| 2014/0284693 A1* | 9/2014 | Sato .................. | H01L 29/66833 438/287 |
| 2015/0270282 A1* | 9/2015 | Koshiishi .......... | H01L 29/66666 438/269 |
| 2015/0364485 A1* | 12/2015 | Shimura ........... | H01L 29/42324 257/316 |
| 2019/0123055 A1 | 4/2019 | Matsumura | |

FOREIGN PATENT DOCUMENTS

| | | |
|---|---|---|
| JP | 2014-183304 A | 9/2014 |
| JP | 2015-149413 A | 8/2015 |
| JP | 2019-79853 A | 5/2019 |

* cited by examiner

*Primary Examiner* — Tu-Tu V Ho
(74) *Attorney, Agent, or Firm* — Oblon, McClelland, Maier & Neustadt, L.L.P.

(57) ABSTRACT

In one embodiment, a semiconductor storage device includes a substrate, a stacked film including a plurality of first insulating layers and a plurality of electrode layers that are alternately provided on the substrate, and a second insulating layer provided on the stacked film. The device further includes a plurality of pillar portions, each of which including a first insulator, a charge storage layer, a second insulator, a first semiconductor layer and a third insulator that are sequentially provided in the stacked film and the second insulating layer. Furthermore, a width of the second insulating layer sandwiched between the pillar portions is narrower than a width of the stacked film sandwiched between the pillar portions, in at least a portion of the second insulating layer.

5 Claims, 10 Drawing Sheets

SEMICONDUCTOR STORAGE DEVICE AND METHOD OF MANUFACTURING THE SAME

CROSS REFERENCE TO RELATED APPLICATION

This application is based upon and claims the benefit of priority from the prior Japanese Patent Application No. 2019-167179, filed on Sep. 13, 2019, the entire contents of which are incorporated herein by reference.

FIELD

Embodiments described herein relate to a semiconductor storage device and a method of manufacturing the same.

BACKGROUND

A three-dimensional semiconductor memory desirably has a smaller thickness of a channel semiconductor layer so as to improve the characteristics of memory cells. However, the smaller thickness of the channel semiconductor layer may cause an abnormality in shape in a vicinity of the channel semiconductor layer.

DETAILED DESCRIPTION

In one embodiment, a semiconductor storage device includes a substrate, a stacked film including a plurality of first insulating layers and a plurality of electrode layers that are alternately provided on the substrate, and a second insulating layer provided on the stacked film. The device further includes a plurality of pillar portions, each of which including a first insulator, a charge storage layer, a second insulator, a first semiconductor layer and a third insulator that are sequentially provided in the stacked film and the second insulating layer. Furthermore, a width of the second insulating layer sandwiched between the pillar portions is narrower than a width of the stacked film sandwiched between the pillar portions, in at least a portion of the second insulating layer.

Embodiments will now be explained with reference to the accompanying drawings. In FIGS. 1 to 10B, identical components are denoted by the same reference symbols to omit redundant explanation.

First Embodiment

Figure 1:
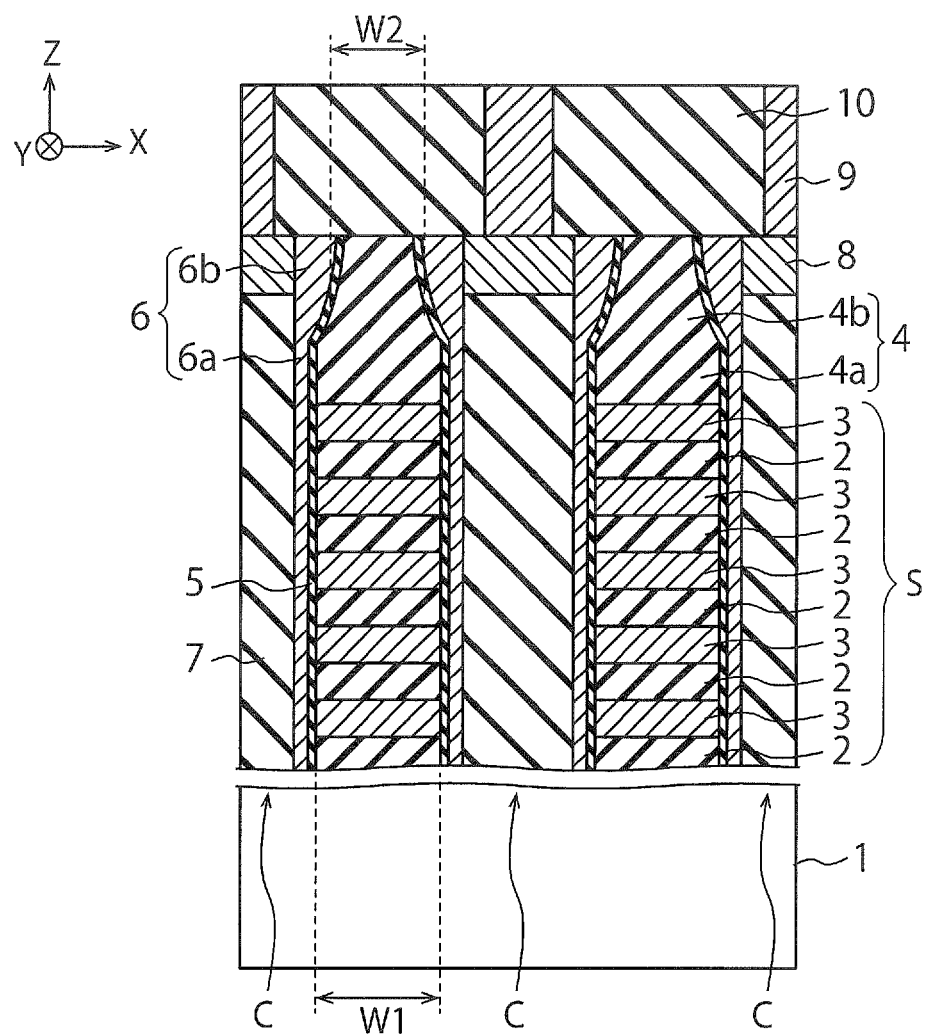
FIG. 1 is a cross-sectional view showing a structure of a semiconductor storage device of a first embodiment.

FIG. 1 is a cross-sectional view showing a structure of a semiconductor storage device of a first embodiment. The semiconductor storage device in FIG. 1 is, for example, a three-dimensional semiconductor memory.

The semiconductor device in FIG. 1 includes a substrate 1, a stacked film S including a plurality of first insulating layers 2 and a plurality of electrode layers 3, a second insulating layer 4, and a plurality of pillar portions C. Each of the pillar portions C includes a memory insulator 5, a channel semiconductor layer 6, a core insulator 7, and a core semiconductor layer 8. The semiconductor storage device in FIG. 1 further includes a plurality of contact plugs 9 and an inter layer dielectric 10.

The substrate 1 is, for example, a semiconductor substrate such as a silicon (Si) substrate. FIG. 1 shows an X direction and a Y direction that are parallel to a surface of the substrate 1 and are vertical to each other, and a Z direction that is vertical to the surface of the substrate 1. In the specification, a +Z direction is assumed as an upward direction and a −Z direction is assumed as a downward direction. The −Z direction may match the gravity direction or does not need to match the gravity direction.

The plurality of first insulating layers 2 and the plurality of electrode layers 3 are alternately formed on the substrate 1, constituting the stacked film S. The stacked film S may be directly formed on the substrate 1 or may be formed on the substrate 1 through another layer. The first insulating layers 2 are, for example, silicon oxide films ($SiO_2$). The electrode layers 3 are, for example, metal layers such as tungsten (W) layers or semiconductor layers such as polysilicon layers, and function as lines such as a word line and a select line. The stacked film S in this embodiment has a width W1.

The second insulating layer 4 is formed on the stacked film S. The second insulating layer 4 is, for example, a silicon oxide film. The second insulating layer 4 in this embodiment includes a first portion 4a formed on the stacked film S and having a width W1, and a second portion 4b formed on the first portion 4a and having a width W2 that is narrower than the width W1. The width W2 of the second portion 4b in this embodiment is reduced upward in the second portion 4b.

The plurality of pillar portions C are formed in the stacked film S and the second insulating layer 4, and here, penetrate the second insulating layer 4 and the stacked film S and reach the substrate 1. These pillar portions C have a pillar shape that extends in the Z direction. Each pillar portion C includes the memory insulator 5, channel semiconductor layer 6 and core insulator 7 which are sequentially formed on a side face of the stacked film S and the second insulating layer 4, and the core semiconductor layer 8 which is formed on the core insulator 7. In addition, the memory insulator 5 includes, as shown in FIG. 2, a block insulator 5a, a charge storage layer 5b and a tunnel insulator 5c which are sequentially formed on a side face of the stacked film S and the second insulating layer 4.

Figure 2:
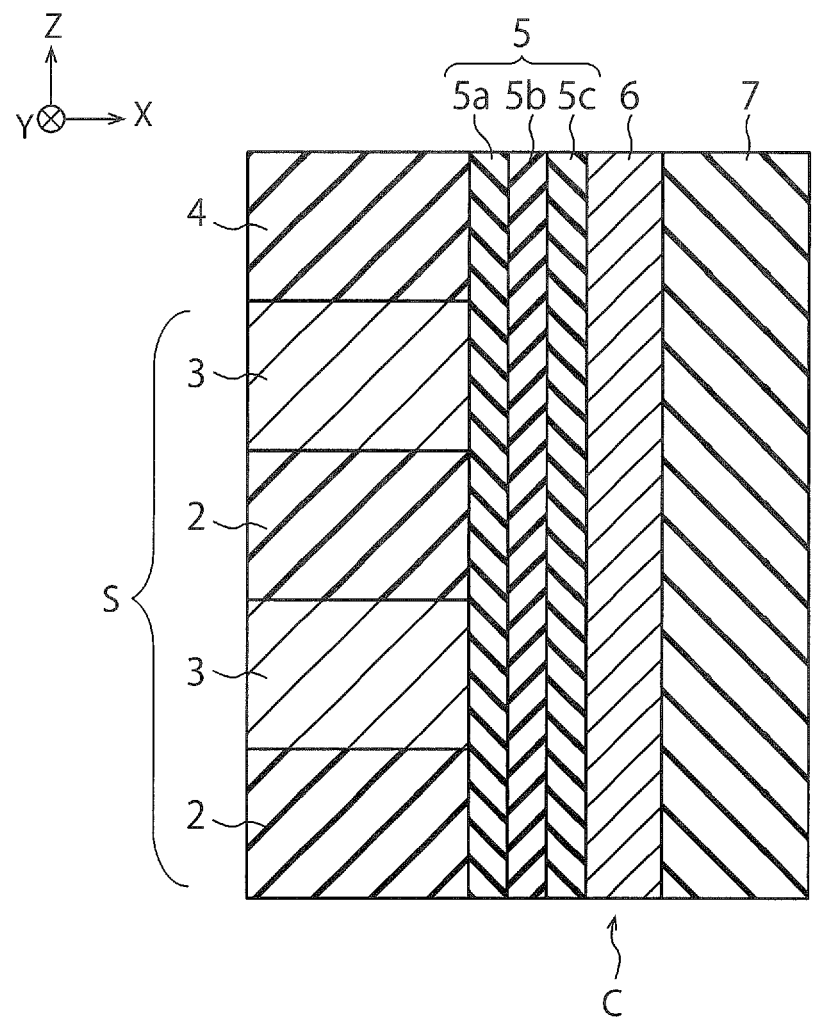
FIG. 2 is an enlarged cross-sectional view showing the structure of the semiconductor storage device of the first embodiment.

FIG. 2 is an enlarged cross-sectional view showing a structure of the semiconductor storage device of the first embodiment.

The block insulator 5a is, for example, a silicon oxide film, a metal oxide film, or a stacked film including them. The charge storage layer 5b is, for example, a silicon nitride film (SiN). The charge storage layer 5b may be a semiconductor layer such as a polysilicon layer. The tunnel insulator 5c is, for example, a silicon oxide film. The channel semiconductor layer 6 is, for example, a polysilicon layer. The core insulator 7 is, for example, a silicon oxide film. The core semiconductor layer 8 (see FIG. 1) is, for example, a polysilicon layer. The block insulator 5a, the charge storage layer 5b, the tunnel insulator 5c, the channel semiconductor layer 6, the core insulator 7, and the core semiconductor layer 8 are examples of a first insulator, a charge storage layer, a second insulator, a first semiconductor layer, a third insulator, and a second semiconductor layer, respectively. In this embodiment, those insulators and layers in each of the pillar portions C constitute a plurality of memory cells.

Hereinafter, the structure of the semiconductor storage device of this embodiment will be described by referring to FIG. 1 again.

In each pillar portion C of this embodiment, the channel semiconductor layer 6 includes a first region 6a that is provided in the stacked film S and in the first portion 4a of the second insulating layer 4, and a second region 6b that is provided in the second portion 4b of the second insulating layer 4, and the thickness of the second region 6b is larger than the thickness of the first region 6a. The thickness of the first region 6a is, for example, 5 nm or less. The thickness of the second region 6b is, for example, 5 nm or more. The thickness of the second region 6b in this embodiment is generally increased upward in the second region 6b. The second region 6b in this embodiment includes silicon atoms and impurity atoms other than silicon atoms. The impurity atoms are, for example, B (boron) atoms or C (carbon) atoms.

In each pillar portion C of this embodiment, the core insulator 7 and the core semiconductor layer 8 have a solid pillar shape that extends in the Z direction, and the memory insulator 5 and the channel semiconductor layer 6 have a hollow pillar shape (that is, a tubular shape) that extends in the Z direction. Therefore, the core insulator 7 and the core semiconductor layer 8 are enclosed by the memory insulator 5 and the channel semiconductor layer 6. The core semiconductor layer 8 of this embodiment is enclosed by the second region 6b of the channel semiconductor layer 6 and the second portion 4b of the second insulating layer 4.

Figure 3A:
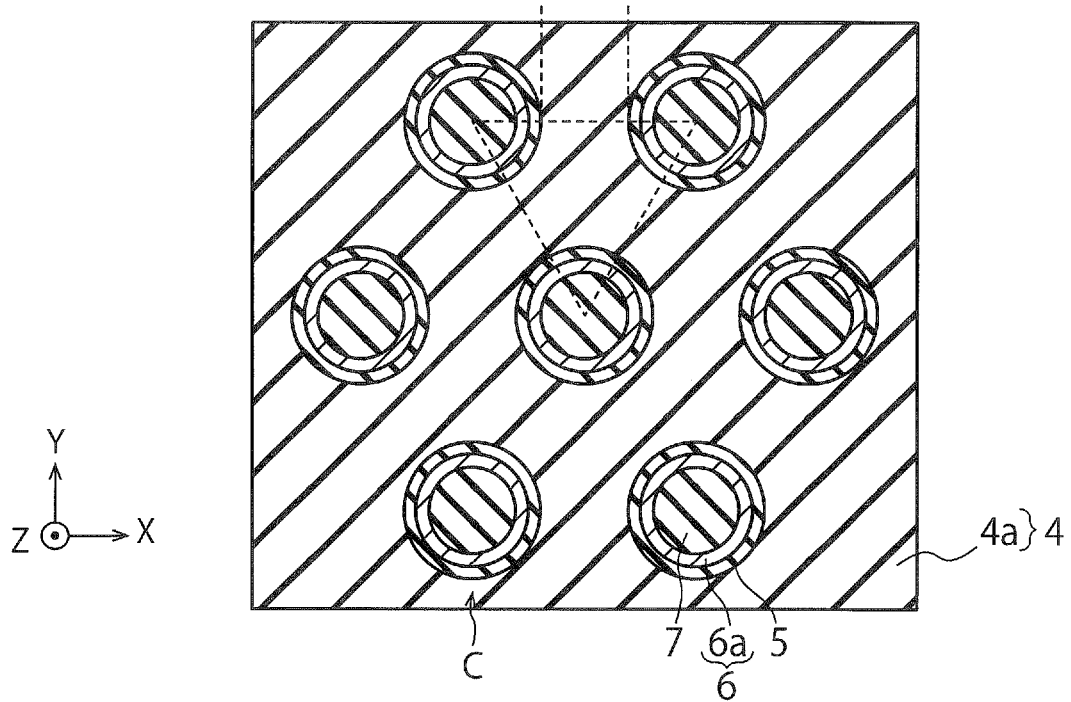
FIGS. 3A and 3B are other cross-sectional views showing the structure of the semiconductor storage device of the first embodiment.
Figure 3B:
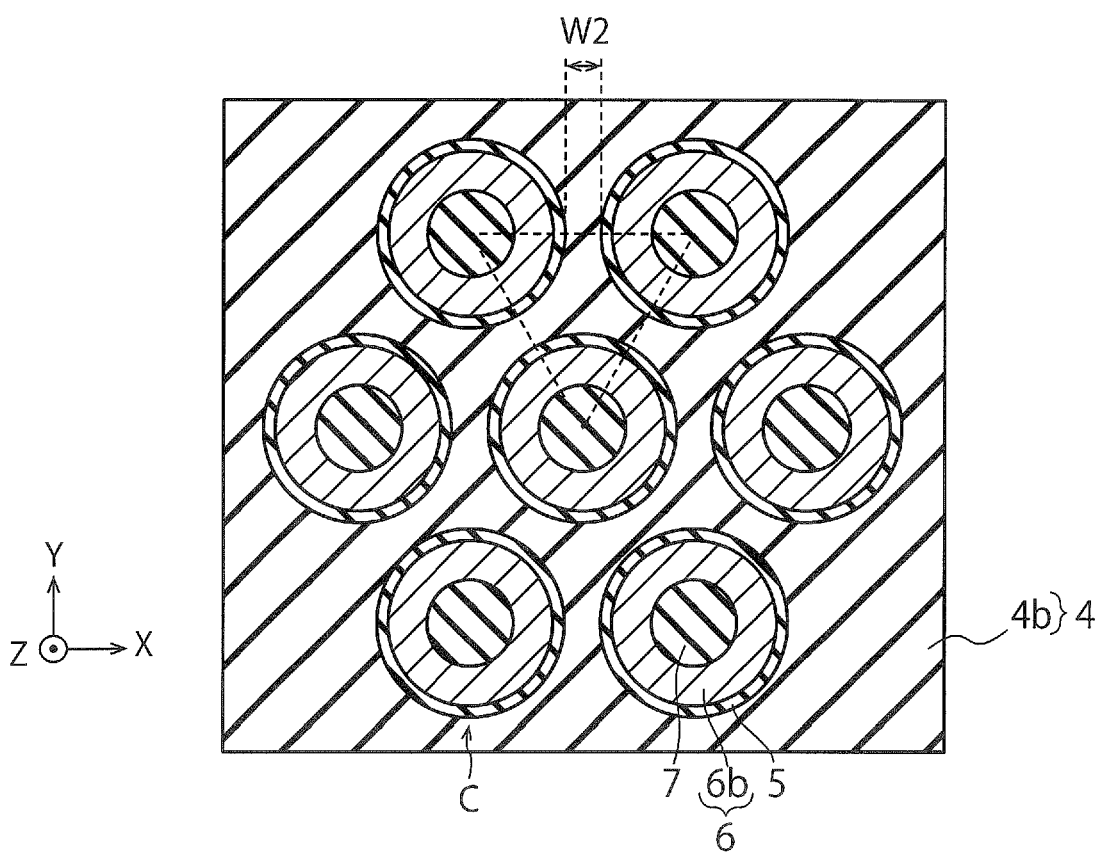

FIGS. 3A and 3B are other cross-sectional views showing the structure of the semiconductor storage device of the first embodiment.

FIG. 3A shows an X-Y cross section taken by cutting the semiconductor storage device of this embodiment at a height of the first portion 4a of the second insulating layer 4. On the other hand, FIG. 3B shows an X-Y cross section taken by cutting the semiconductor storage device of this embodiment at a height of the second portion 4b of the second insulating layer 4.

As shown in FIG. 3A and FIG. 3B, the plurality of pillar portions C of this embodiment are arranged in a triangular lattice form. In this embodiment, the second insulating layer 4 (and the stacked film S) fill a space between the pillar portions C. The core insulator 7 (and the core semiconductor layer 8) in each of the pillar portions C is enclosed by the memory insulator 5 and the channel semiconductor layer 6.

FIG. 3A shows a width W1 of the first portion 4a which is sandwiched between the pillar portions C, as a width of the second insulating layer 4 which is sandwiched between the pillar portions C. The width W1 corresponds to a width of the stacked film S which is sandwiched between the pillar portions C (see FIG. 1). On the other hand, FIG. 3B shows a width W2 of the second portion 4b which is sandwiched between the pillar portions C, as a width of the second insulating layer 4 which is sandwiched between the pillar portions C. The width W1 and the width W2 are widths on the X-Y cross sections of the second insulating layer 4 which is sandwiched between the pillar portions C.

In this embodiment, the second portion 4b which is sandwiched between the pillar portions C has a shape that tapers upward. Therefore, the width W2 is narrower than the width W1, and a relation of "W2<W1" is satisfied (however, the width W2 of a bottom face of the second portion 4b is the same as the width W1, and a relation of "W2=W1" is satisfied). As described above, the width of the second insulating layer 4 which is sandwiched between the pillar portions C is narrower than the width of the stacked film S which is sandwiched between the pillar portions C in the second portion 4b of the second insulating layer 4. The second portion 4b of the second insulating layer 4 of this embodiment includes a portion which is sandwiched between the core insulators 7 of the pillar portions C, and a portion which is sandwiched between the core semiconductor layers 8 of the pillar portions C (see FIG. 1).

The plurality of pillar portions C of this embodiment may be arranged in a layout other than a triangular lattice. These pillar portions C may be arranged in, for example, a square lattice form. In addition, the shape of each of the pillar portions C on the X-Y cross sections is a circle in this embodiment, however may be another shape (for example, a square).

Hereinafter, the structure of the semiconductor storage device of this embodiment will be described by referring to FIG. 1 again.

The plurality of contact plugs 9 are formed on the plurality of pillar portions C. Each of the contact plugs 9 is formed on the core semiconductor layer 8 of its corresponding pillar portion C. Therefore, each of the contact plugs 9 is electrically connected to the core semiconductor layer 8 and channel semiconductor layer 6 of its corresponding pillar portion C. The contact plugs 9 each includes, for example, a barrier metal layer including titanium (Ti) or Ta (tantalum), and a plug material layer including tungsten (W), copper (Cu), or aluminum (Al).

The inter layer dielectric 10 is formed on the second insulating layer 4 and the plurality of pillar portions C. Each of the contact plugs 9 is embedded in the inter layer dielectric 10. The inter layer dielectric 10 is, for example, a silicon oxide film.

Hereinafter, the semiconductor storage device of this embodiment will be described in more details.

The semiconductor storage device of this embodiment is, for example, a three-dimensional semiconductor memory. In this case, it is desirable that the thickness in the channel semiconductor layer 6 is reduced so as to improve the characteristics of memory cells of the three-dimensional semiconductor memory. Therefore, the channel semiconductor layer 6 of this embodiment has a small thickness of 5 nm or less in the first region 6a.

However, a smaller thickness of the channel semiconductor layer 6 may cause an abnormality in shape in a vicinity of the channel semiconductor layer 6. For example, in a case where openings for embedding the pillar portions C are formed in the stacked film S and the second insulating layer 4 and the channel semiconductor layer 6 is formed in each opening, if the thickness of the channel semiconductor layer 6 is smaller, a hole may be generated in the channel semiconductor layer 6 in a vicinity of the second insulating layer 4. If the hole is generated in the channel semiconductor layer 6 in the vicinity of the second insulating layer 4, the second insulating layer 4 may be etched or the core semiconductor layer 8 may be grown in an abnormal shape, for example. As described above, the smaller thickness of the channel semiconductor layer 6 may cause an abnormality in shape in the channel semiconductor layer 6, or the insulator or layer in the vicinity thereof.

Therefore, in this embodiment, the thickness of the channel semiconductor layer 6 in the vicinity of the second insulating layer 4 is set to be larger. Specifically, the thickness of the second region 6b in the channel semiconductor layer 6 is set so as to be larger than that of the first region 6a in the channel semiconductor layer 6. This can prevent a hole from being generated in the channel semiconductor layer 6 in the vicinity of the second insulating layer 4.

However, a larger thickness in the channel semiconductor layer 6 in the vicinity of the second insulating layer 4 may cause the above-described openings to be closed in the vicinity of the second insulating layer 4. If the opening is closed in the vicinity of the second insulating layer 4, it becomes possible or difficult to embed the pillar portion C in the opening. As described above, a larger thickness in the channel semiconductor layer 6 in the vicinity of the second insulating layer 4 may cause an abnormality in shape in the channel semiconductor layer 6, or the insulator or layer in the vicinity thereof.

Therefore, in this embodiment, a width of at least a portion of the second insulating layer 4 is set to be narrower than the width of the stacked film S (W2<W1). Specifically, the second insulating layer 4 in this embodiment includes the first portion 4a formed on the stacked film S and having the width W1, and the second portion 4b formed on the first portion 4a and having the width W2 that is narrower than the width W1. This can prevent the openings from being closed in the vicinity of the second insulating layer 4 while setting the thickness in the channel semiconductor layer 6 in the vicinity of the second insulating layer 4 to be larger. As described above, this embodiment can prevent an abnormality in shape from occurring in the vicinity of the channel semiconductor layer 6.

Hereinafter, more details of the above description will be described with reference to FIGS. 4A to 9B.

FIGS. 4A to 9B are cross-sectional views showing a method of manufacturing the semiconductor storage device of the first embodiment.

Figure 4B:
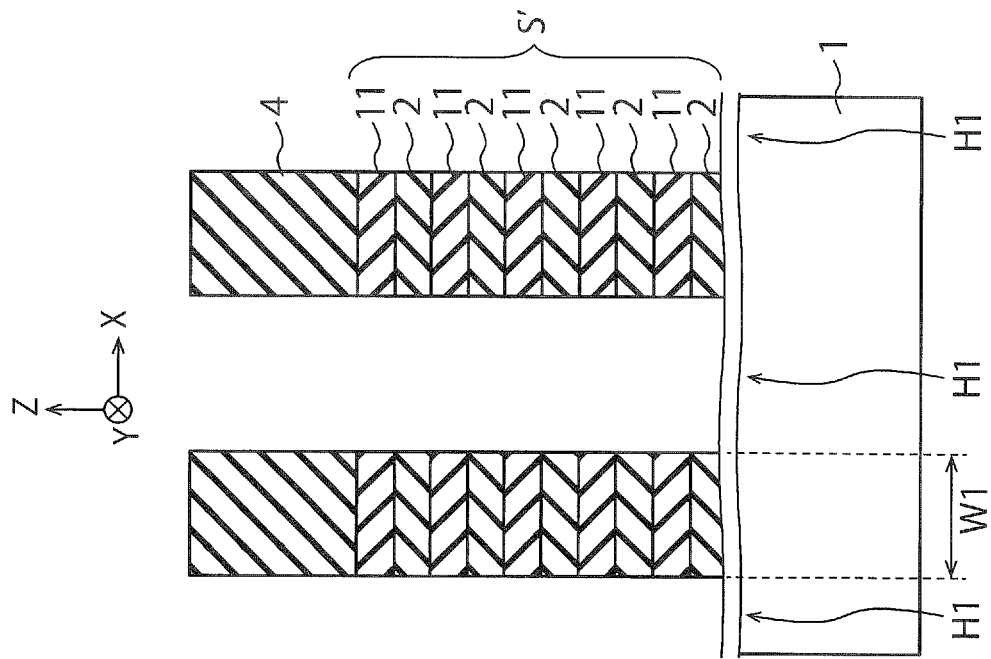
FIGS. 4A to FIG. 9B are cross-sectional views showing a method of manufacturing the semiconductor storage device of the first embodiment.
Figure 4A:
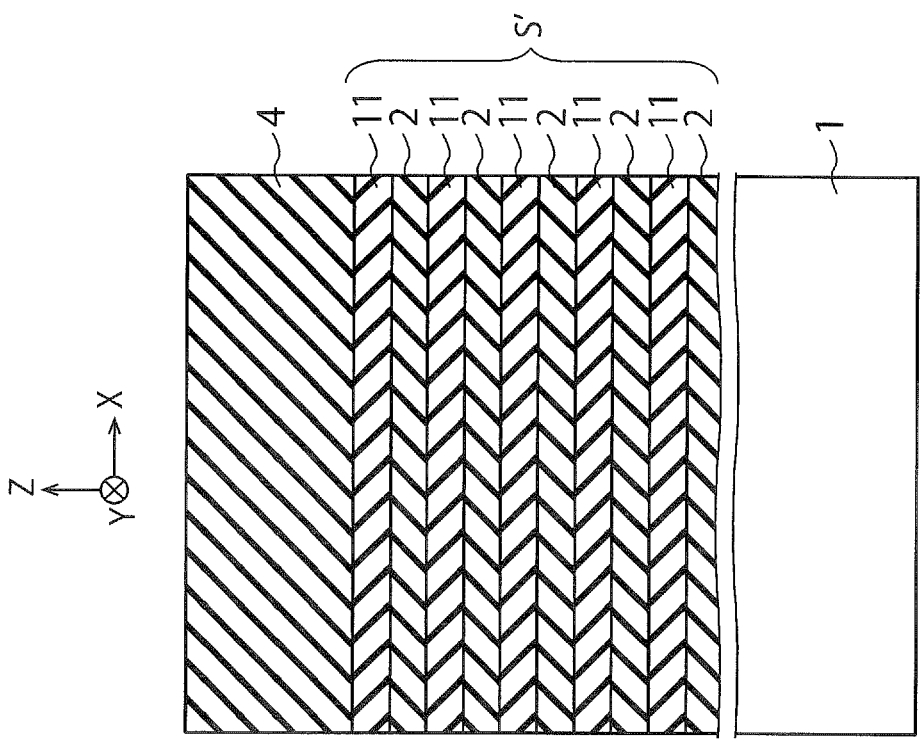

First, a stacked film S' alternately including the plurality of first insulating layers 2 and a plurality of sacrificial layers 11 is formed on the substrate 1, and the second insulating layer 4 is formed on the stacked film S' (FIG. 4A). The stacked film S' may be directly formed on the substrate 1 or may be formed on the substrate 1 through another layer. The first insulating layers 2 are, for example, silicon oxide films. The plurality of sacrificial layers 11 are, for example, silicon nitride films. The second insulating layer 4 is, for example, a silicon oxide film. The sacrificial layers 11 are examples of first films.

Next, a plurality of openings H1 are formed in the stacked film S' and the second insulating layer 4 by RIE (Reactive Ion Etching) (FIG. 4B). The openings H1 of this embodiment are formed so as to reach the substrate 1 through the second insulating layer 4 and the stacked film S'. The openings H1 of this embodiment are memory holes and used for embedding the pillar portions C. FIG. 4B shows the width W1 of the stacked film S' (and the second insulating layer 4) sandwiched between the openings H1.

Figure 5A:
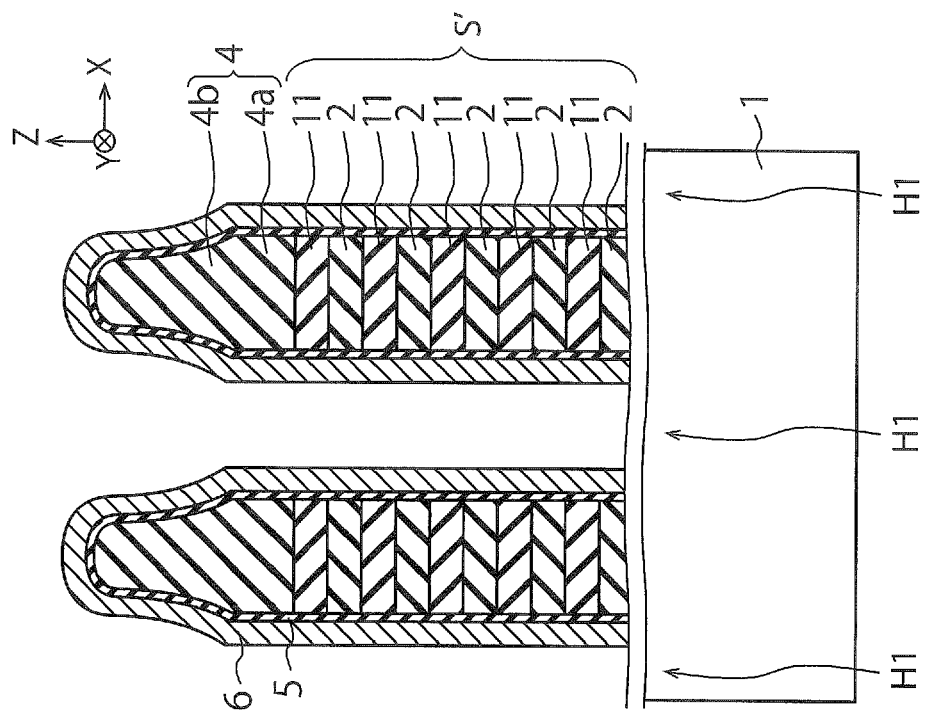

Next, argon ions are implanted into the second insulating layer 4 and the second insulating layer 4 is processed with dilute hydrofluoric acid (FIG. 5A). As a result, an ion-implanted area is formed in the second insulating layer 4, and this area is processed so as to have a shape including the first portion 4a that is formed on the stacked film S' and has the width W1, and the second portion 4b that is formed on the first portion 4a and has the width W2 which is narrower than the width W1. An element to be implanted is not limited to argon as long as not having conductivity in the semiconductor. In addition, ion implantation into the second insulating layer 4 is preferably performed such that an ion proceeding direction is inclined a little with respect to the −Z direction.

Figure 5B:
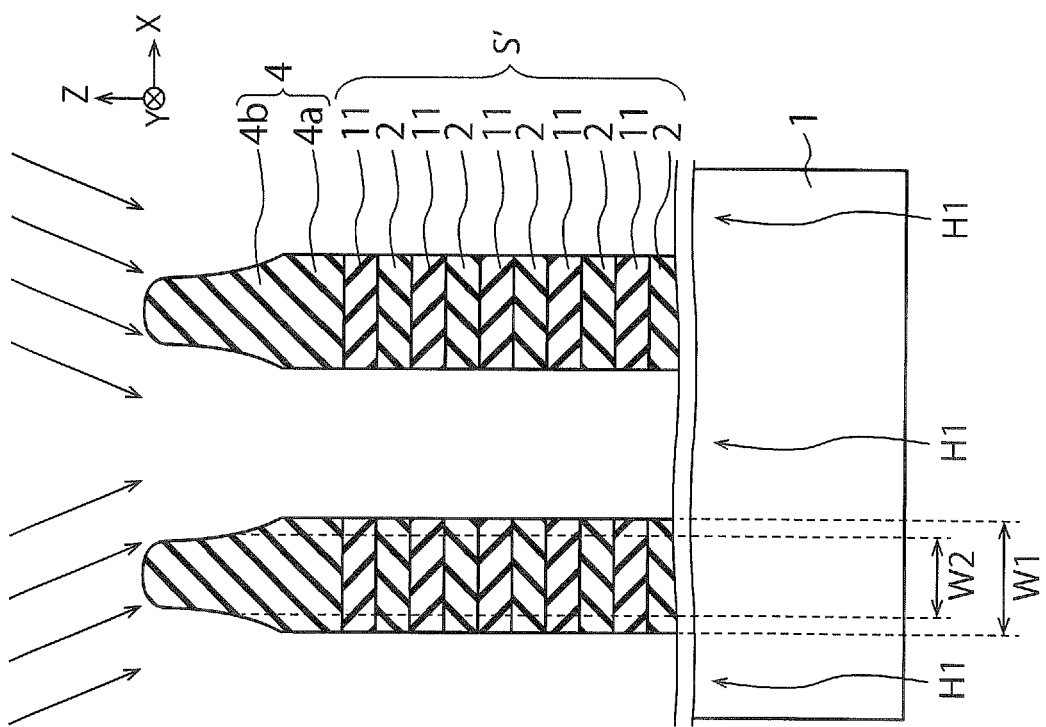

Next, the memory insulator 5 and the channel semiconductor layer 6 are sequentially formed on an entire surface of the substrate 1 (FIG. 5B). As a result, the memory insulator 5 and the channel semiconductor layer 6 are conformally formed on the surfaces of the stacked film S' and second insulating layer 4 inside the openings H1 and outside the openings H1. The memory insulator 5 is formed by sequentially forming the block insulator 5a, the charge storage layer 5b and the tunnel insulator 5c on the entire surface of the substrate 1 (see FIG. 2).

Figure 6A:
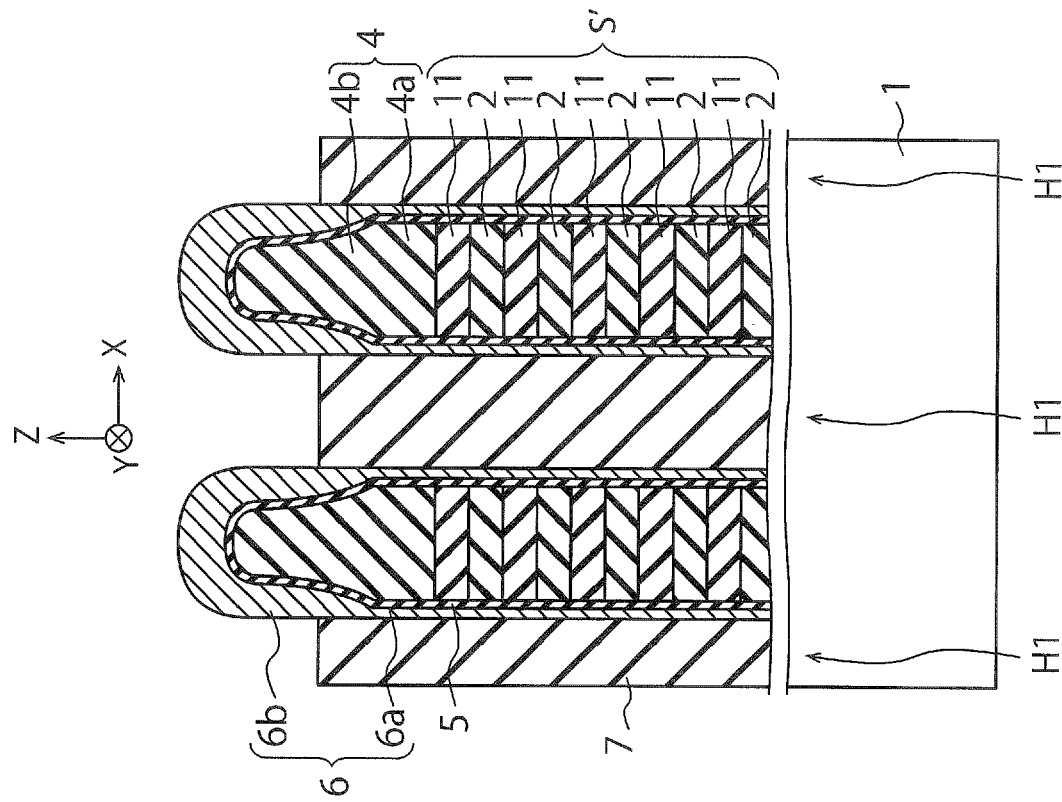

Next, impurity atoms are implanted into the channel semiconductor layer 6 in the vicinity of the second insulating layer 4 by ion implantation (FIG. 6A). This ion implantation is preferably performed such that the ion proceeding direction is inclined a little with respect to the −Z direction. The impurity atoms are, for example, B (boron) atoms or C (carbon) atoms.

In this embodiment, subsequently, the channel semiconductor layer 6 is slimmed with an alkaline aqueous solution (FIG. 6A). After slimming, the thickness of the first region 6a in the channel semiconductor layer 6 is, for example, 5 nm or less. According to an experiment, an ion-implanted channel semiconductor layer 6 has an improved resistance against a chemical solution in comparison with a non-implanted semiconductor layer 6. Therefore, the thickness of the second region 6b in the channel semiconductor layer 6 is, for example, 5 nm or less. As a result, the channel semiconductor layer 6 of FIG. 6A is changed so as to have a shape including the first region 6a that is formed on a side face of the memory insulator 5 in the vicinity of the stacked film S' and in the vicinity of the first portion 4a of the second insulating layer 4, and the second region 6b that is formed on a side face of the memory insulator in the vicinity of the second portion 4b of the second insulating layer 4 and has a thickness larger than the thickness of the first region 6a. Therefore, the second region 6b of the channel semiconductor layer 6 of this embodiment includes impurity atoms.

Here, it should be noted that the second region 6b of the channel semiconductor layer 6 is formed on a side face of the second portion 4b of the second insulating layer 4 through the memory insulator 5. If the width W2 of the second portion 4b is the same as the width W1 of the first portion 4a, the second region 6b significantly protrudes toward a central axis of each of the openings H1 and it may cause the openings H1 to be closed. However, the width W2 of the second portion 4b of this embodiment is less than the width W1 of the first portion 4a, and this prevents the second region 6b from closing the openings H1. In addition, the thickness of the second region 6b of this embodiment is larger than the thickness of the first region 6a, and this can prevent a hole from being generated on the channel semiconductor layer 6 in the vicinity of the second insulating layer 4.

In FIG. 6A, a side face outside the second region 6b is drawn to be flat, however, it may have such a degree of inclination and unevenness that do not cause closure. Since the second region 6b of this embodiment is formed by ion implantation as described above, it is considered to have such an inclination and unevenness in many cases.

Figure 6B:
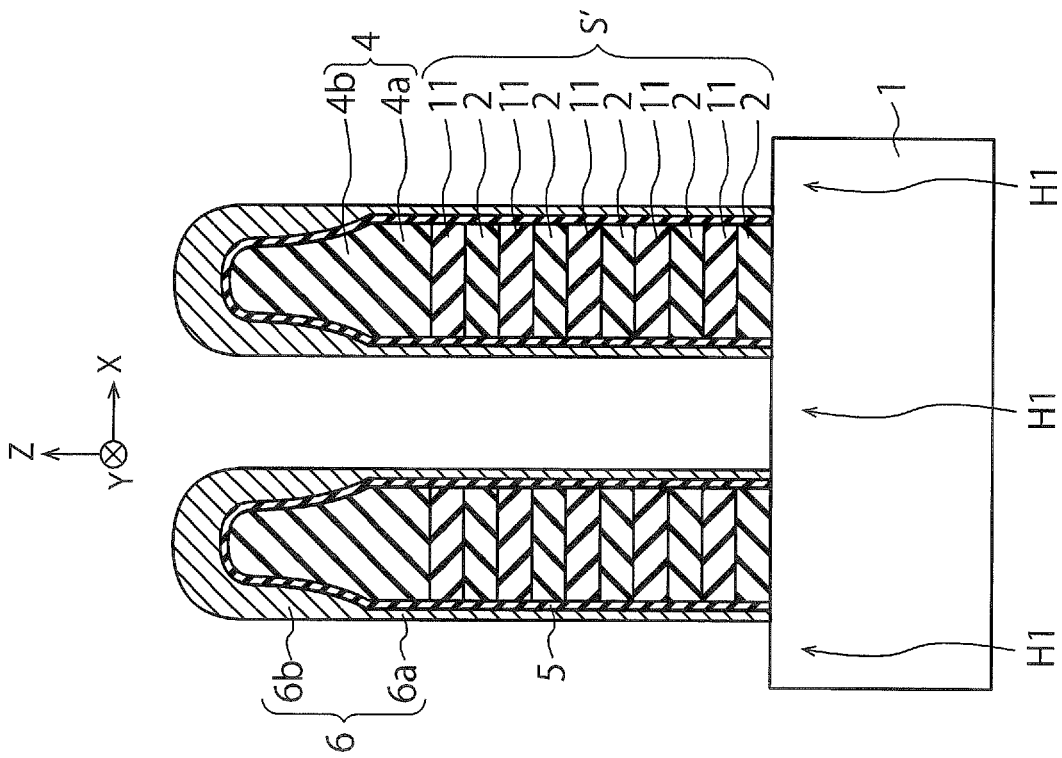

Next, the core insulator 7 is formed in each of the openings H1 and after that, a portion of the core insulator 7 in the opening H1 is removed (FIG. 6B). In this embodiment, the core insulator 7 is processed such that an upper face of the core insulator 7 contacts the second region 6b of the channel semiconductor layer 6.

Figure 7A:
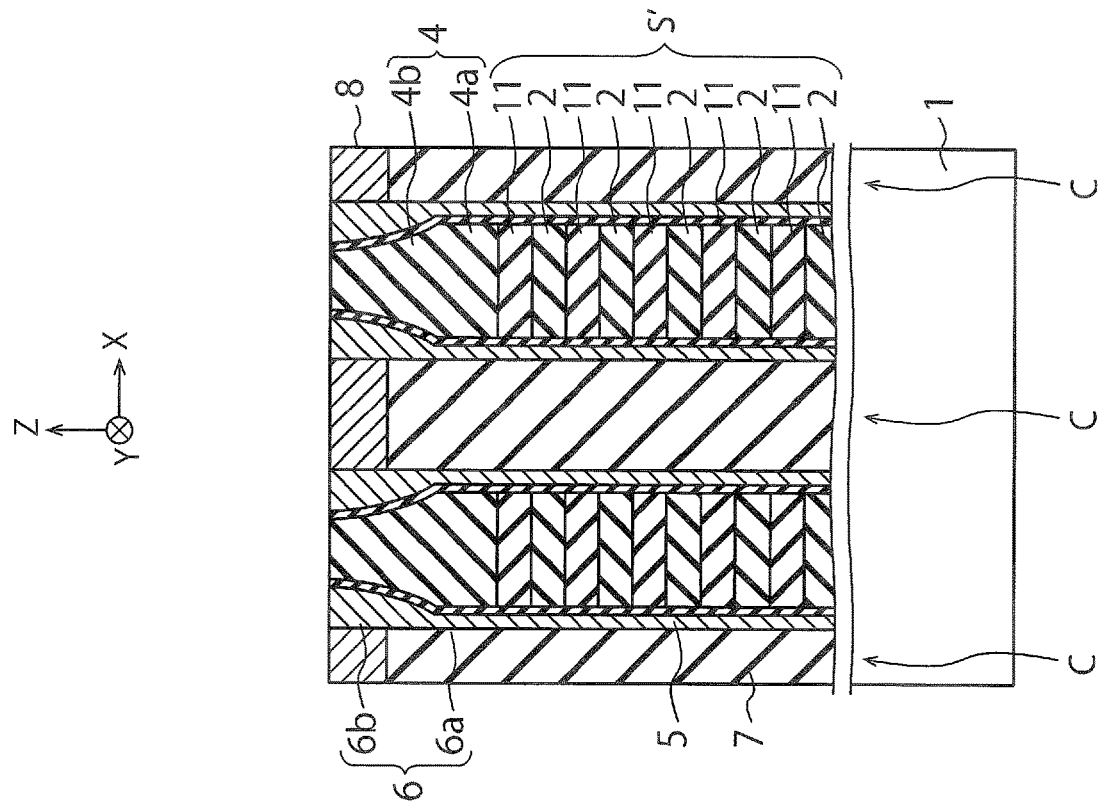
Figure 7B:
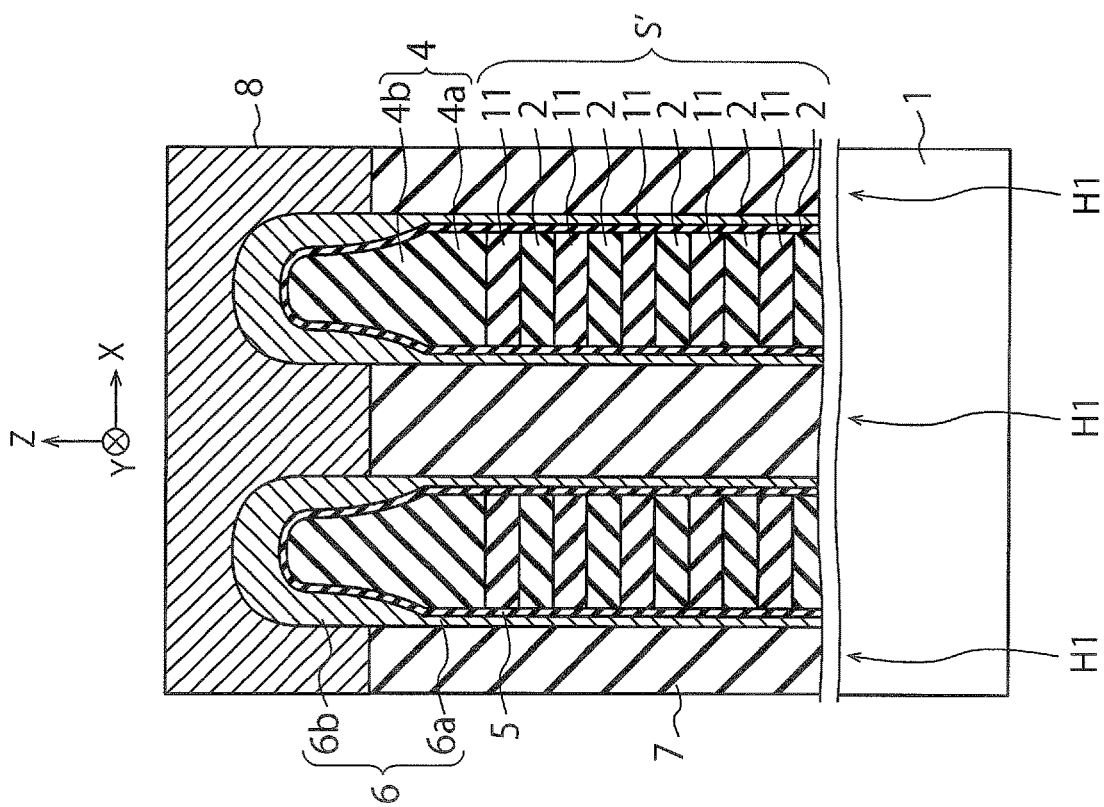

Next, the core semiconductor layer 8 is formed on the entire surface of the substrate 1 and after that, the core semiconductor layer 8 outside the openings H1 is removed by RIE (FIGS. 7A and 7B). As a result, the core semiconductor layer 8 is formed on the core insulator 7 in each of the openings H1 and the core semiconductor layer 8 is electrically connected to the channel semiconductor layer 6. In this way, the plurality of pillar portions C are formed in the openings H1. The above described RIE of this embodiment is performed such that a portion of the second portion 4b of the second insulating layer 4 is removed.

Figure 8A:
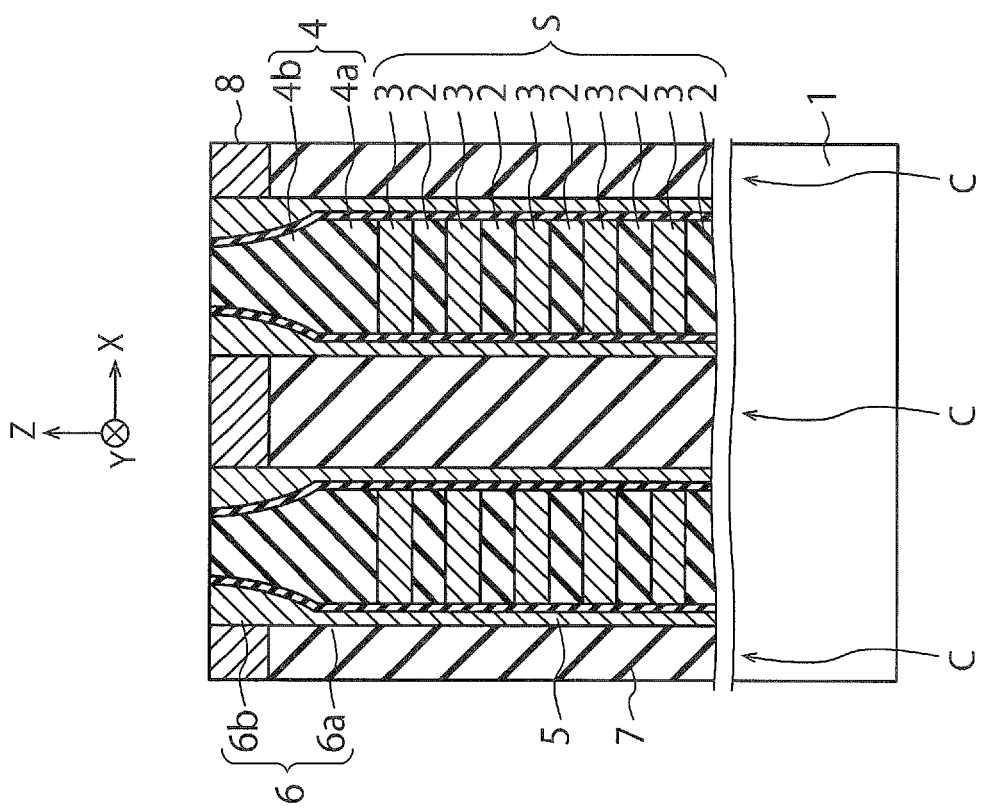
Figure 8B:
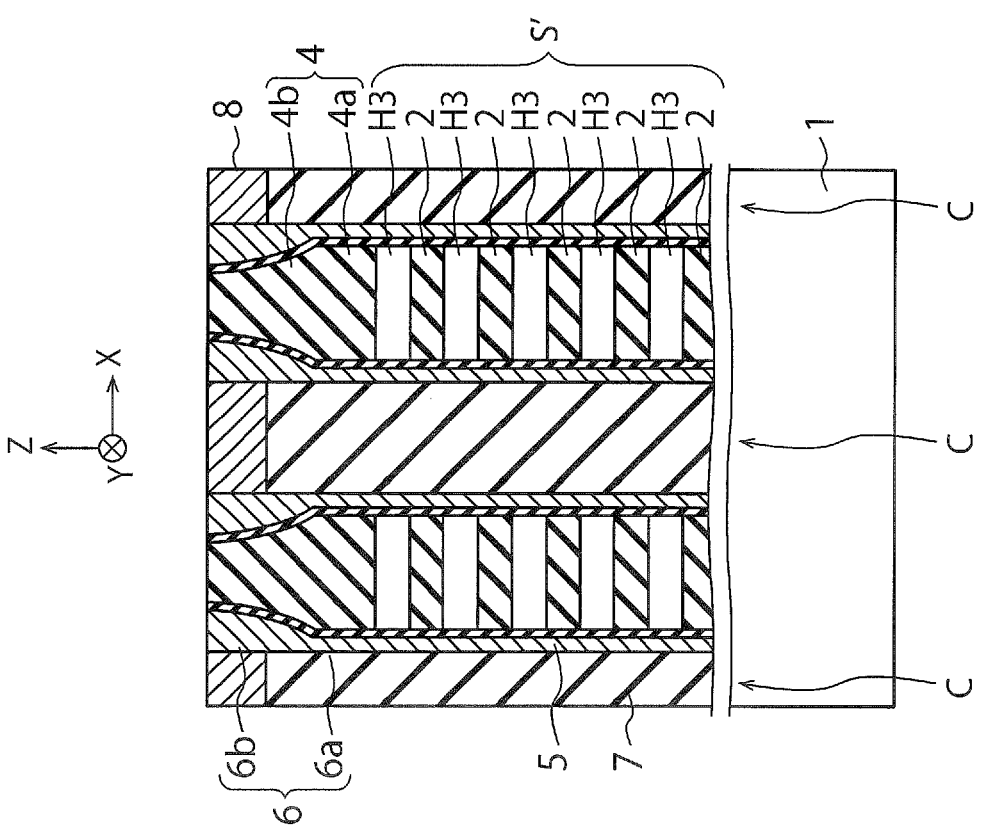

Next, an unillustrated opening that penetrates the stacked film S' and the second insulating layer 4 is formed to remove the sacrificial layers 11 from the opening (FIG. 8A). As a result, a plurality of holes H3 are formed between the first insulating layers 2 in the stacked film S'. Next, the plurality of electrode layers 3 are formed in these holes H3 (FIG. 8B). In this way, the sacrificial layers 11 are replaced with the electrode layers 3 and the stacked film S that alternately includes the plurality of first insulating layers 2 and the plurality of electrode layers 3 is formed on the substrate 1.

In a process in FIG. 4A, the stacked film S that alternately includes the plurality of first insulating layers 2 and the plurality of electrode layers 3 may be formed on the substrate 1, instead of forming the stacked film S' that alternately includes the plurality of first insulating layers 2 and the plurality of sacrificial layers 11. In this case, it is not necessary to execute processes in FIG. 8A and FIG. 8B. In addition, the electrode layers 3 in this case are examples of the first films.

Figure 9A:
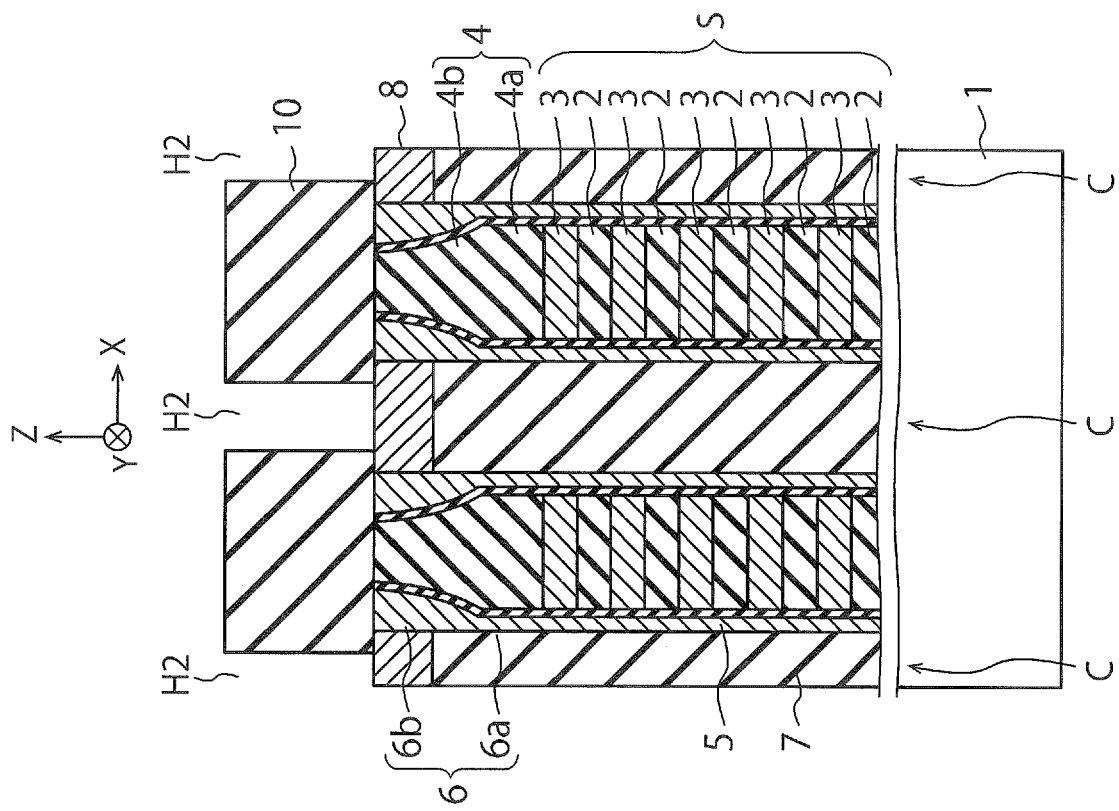
Figure 9B:
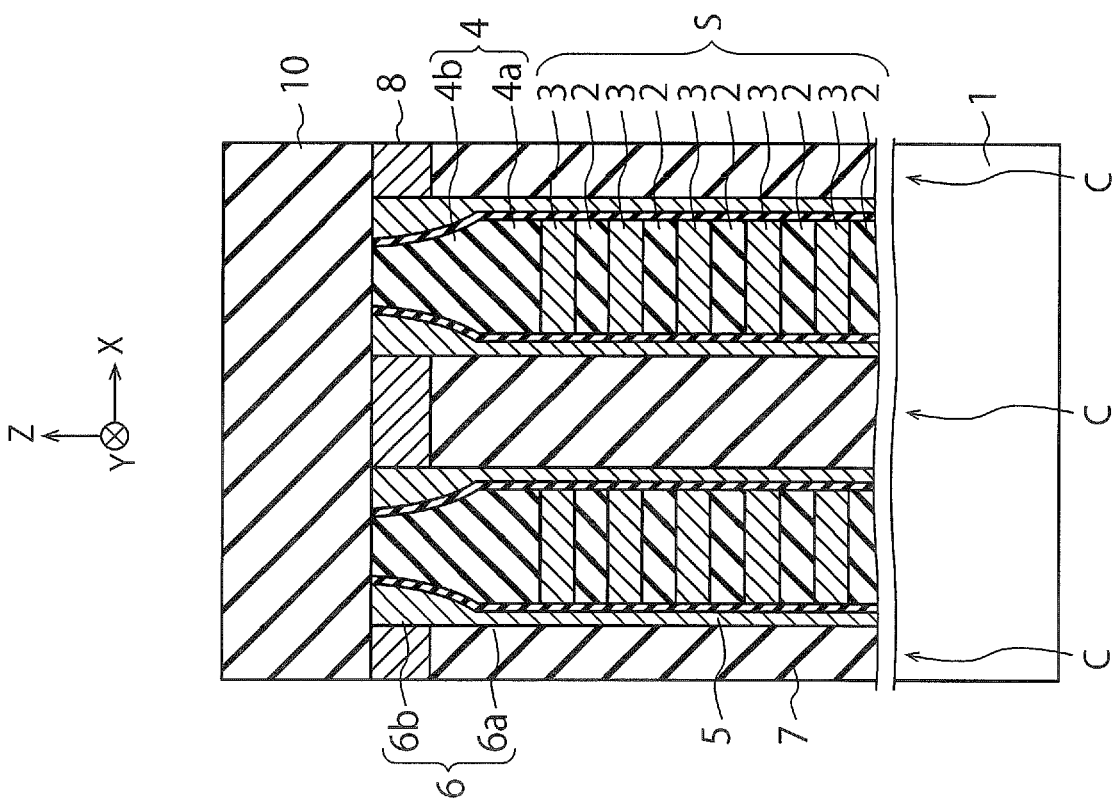

Next, the inter layer dielectric 10 is formed on the second insulating layer 4 and the pillar portions C (FIG. 9A). Next, a plurality of contact holes H2 are formed in the inter layer dielectric 10 (FIG. 9B). As a result, an upper face of the core semiconductor layer 8 of a corresponding one of the pillar portions C is exposed in each of the contact holes H2. After that, the contact plug 9 is formed on the core semiconductor layer 8 in each of the contact holes H2 (see FIG. 1). In this way, the semiconductor storage device of this embodiment is manufactured.

Figure 10B:
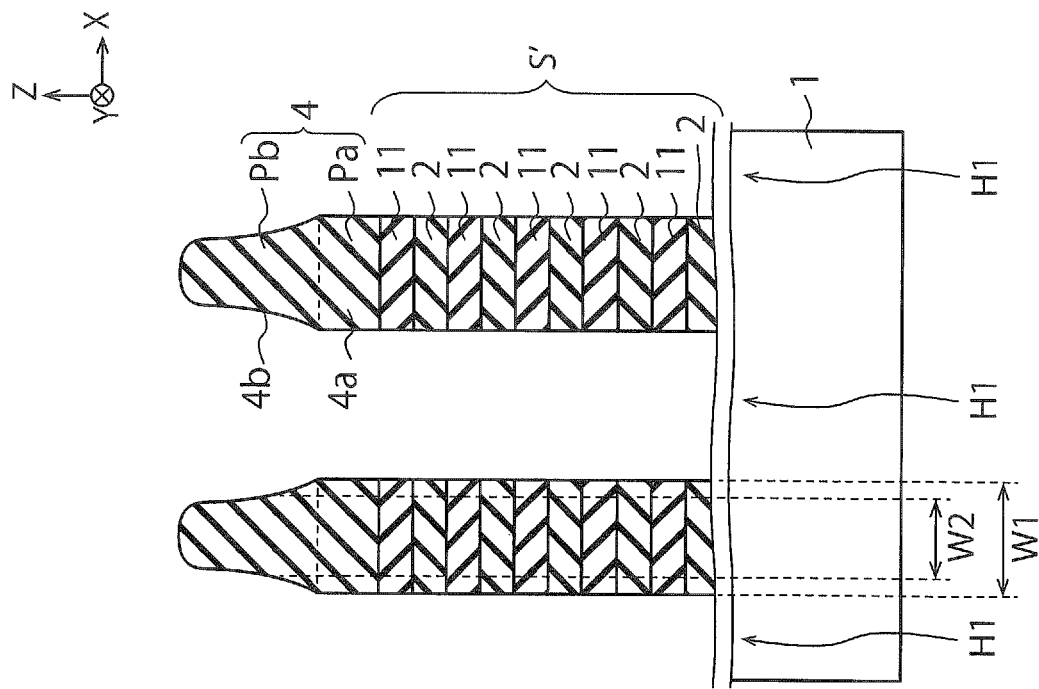
FIGS. 10A and 10B are cross-sectional views showing details of the method of manufacturing the semiconductor storage device of the first embodiment.
Figure 10A:
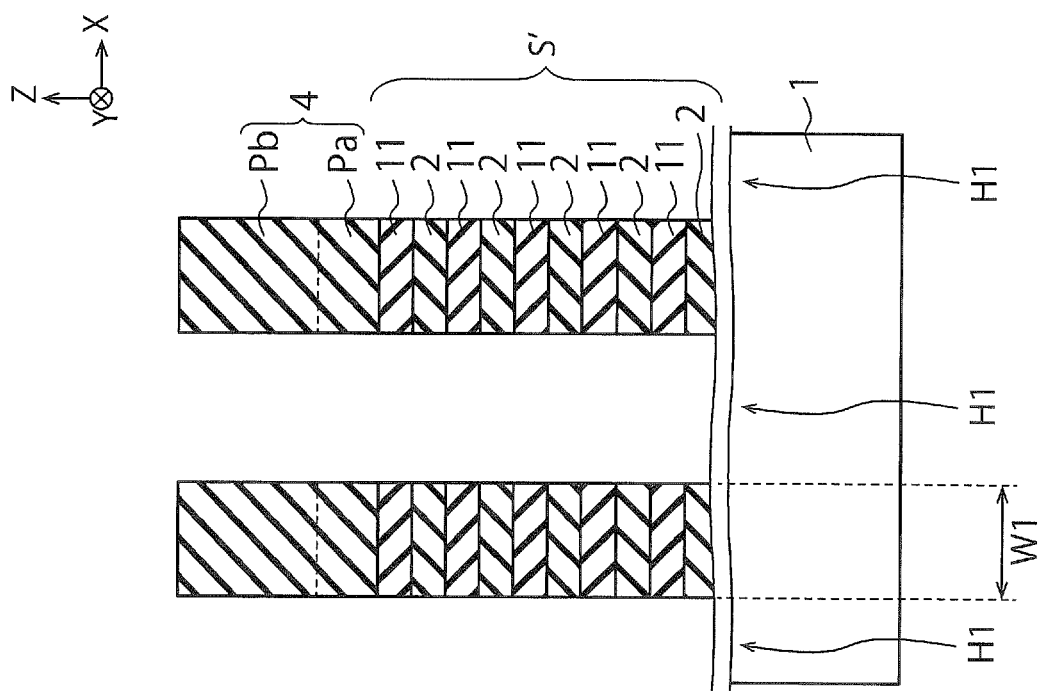

FIGS. 10A and 10B are cross-sectional views showing details of the method of manufacturing the semiconductor storage device of the first embodiment.

FIG. 10A shows the same cross-section as that in FIG. 4B. The second insulating layer 4 of this embodiment may be formed, for example, so as to include a first $SiO_2$ film Pa that is formed on the stacked film S' and has a first film quality, and a second $SiO_2$ film Pb that is formed on the first $SiO_2$ film Pa and has a second film quality. For example, the second insulating layer 4 may be formed such that an etching rate of the second $SiO_2$ film Pb is higher than an etching rate of the first $SiO_2$ film Pa.

In this case, when liquid chemical treatment such as dilute hydrofluoric acid treatment is performed, the second $SiO_2$ film Pb is more easily etched than the first $SiO_2$ film Pa. As a result, this second insulating layer 4 is processed so as to have a shape including the first portion 4a that is formed on the stacked film S' and has the width W1, and a second portion 4b that is formed on the first portion 4a and has a width W2 which is narrower than the width W1 (FIG. 10B). Specifically, the first $SiO_2$ film Pa is the first portion 4a and the second $SiO_2$ film Pb is the second portion 4b.

The first $SiO_2$ film Pa and the second $SiO_2$ film Pb that are different in film quality can be obtained by, for example, forming the first $SiO_2$ film Pa and the second $SiO_2$ film Pb by different methods. In addition, the first $SiO_2$ film Pa and the second $SiO_2$ film Pb that are different in film quality can also be obtained by, for example, forming the first $SiO_2$ film Pa and the second $SiO_2$ film Pb by an identical method and damaging the second $SiO_2$ film Pb with argon gas or the like.

As described above, in this embodiment, the second insulating layer 4 which is sandwiched between the pillar portions C includes the second portion 4b having the width W2 narrower than the width W1 of the stacked film S which is sandwiched between the pillar portions C. Therefore, this embodiment can prevent an abnormality in shape from occurring in the vicinity of the channel semiconductor layer 6 while improving the characteristics of the memory cells.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
   a substrate;
   a stacked film including a plurality of first insulating layers and a plurality of electrode layers that are alternately provided on the substrate;
   a second insulating layer provided on the stacked film; and
   a plurality of pillar portions, each of which including a first insulator, a charge storage layer, a second insulator, a first semiconductor layer, and a third insulator that are sequentially provided in the stacked film and the second insulating layer;
   wherein
   a width of the second insulating layer sandwiched between the pillar portions is, narrower than a width of the stacked film sandwiched between the pillar portions, in at least a portion of the second insulating layer,
   the second insulating layer includes:
      a first portion provided on the stacked film; and
      a second portion provided on the first portion, a width of the second portion sandwiched between the pillar portions being narrower than the width of the stacked film sandwiched between the pillar portions; and
   the first semiconductor layer includes:
      a first region provided on a side face of the stacked film and a side face of the first portion of the second insulating layer through the first insulator; and
      a second region provided on a side face of the second portion of the second insulating layer through the first insulator, the second region having a thickness larger than a thickness of the first semiconductor layer provided on the side face of the stacked film through the first insulator.

2. The device of claim 1, wherein the first region has a thickness of 5 nm or less.

3. The device of claim 1, wherein the second region has a thickness of 5 nm or more.

4. A method of manufacturing a semiconductor storage device, comprising:
   forming a stacked film on a substrate, the stacked film alternately including a plurality of first insulating layers and a plurality of first films;

forming a second insulating layer on the stacked film;
forming a plurality of openings in the stacked film and the second insulating layer;
processing the second insulating layer such that a width of the second insulating layer sandwiched between the openings is narrower than a width of the stacked film sandwiched between the openings, in at least a portion of the second insulating layer; and
forming a plurality of pillar portions in the plurality of openings, each of the pillar portions sequentially including a first insulator, a charge storage layer, a second insulator, a first semiconductor layer, and a third insulator;
wherein
the first semiconductor layer is formed such that a thickness of at least of a portion of the first semiconductor layer formed in the second insulating layer is larger than a thickness of the first semiconductor layer formed in the stacked film, and
the second insulating layer is processed with acid after ion implantation into the second insulating layer.

5. A method of manufacturing a semiconductor storage device, comprising:
forming a stacked film on a substrate, the stacked film alternately including a plurality of first insulating layers and a plurality of first films;
forming a second insulating layer on the stacked film;
forming a plurality of openings in the stacked film and the second insulating layer;
processing the second insulating layer such that a width of the second insulating layer sandwiched between the openings is narrower than a width of the stacked film sandwiched between the openings, in at least a portion of the second insulating layer, and
forming a plurality of pillar portions in the plurality of openings, each of the pillar portions sequentially including a first insulator, a charge storage layer, a second insulator, a first semiconductor layer, and a third insulator;
wherein
the first semiconductor layer is formed such that a thickness of at least of a portion of the first semiconductor layer formed in the second insulating layer is larger than a thickness of the first semiconductor layer formed in the stacked film, and
the second insulating layer is processed so as to include:
a first portion provided on the stacked film; and
a second portion provided on the first portion, a width of the second portion sandwiched between the openings being narrower than the width of the stacked film sandwiched between the openings;
the method further comprising removing a portion of the second portion after forming the pillar portions.

* * * * *